US008953325B2

(12) United States Patent
Yu et al.

(10) Patent No.: US 8,953,325 B2
(45) Date of Patent: Feb. 10, 2015

(54) ELECTRONIC DEVICE WITH HEAT DISSIPATING AND ELECTROMAGNETIC SHIELDING MASK

(71) Applicant: SerComm Corporation, Taipei (TW)

(72) Inventors: Yi-Fei Yu, New Taipei (TW);
Yuan-Heng Huang, Taichung (TW)

(73) Assignee: SerComm Corporation, Taipei (TW)

( * ) Notice: Subject to any disclaimer, the term of this patent is extended or adjusted under 35 U.S.C. 154(b) by 322 days.

(21) Appl. No.: 13/688,404

(22) Filed: Nov. 29, 2012

(65) Prior Publication Data

US 2013/0182392 A1 Jul. 18, 2013

(30) Foreign Application Priority Data

Jan. 18, 2012 (CN) ..................... 2012 2 0023403 U

(51) Int. Cl.
*H05K 7/20* (2006.01)
*H05K 9/00* (2006.01)
(52) U.S. Cl.
CPC ............ *H05K 7/2039* (2013.01); *H05K 9/0007* (2013.01); *H05K 7/20509* (2013.01); *H05K 9/002* (2013.01)
USPC ...................... 361/719; 165/104.33; 174/15.1
(58) Field of Classification Search
CPC ..................... G06F 1/181–1/182; H05K 7/20
USPC ............... 361/679.46–679.54, 688–723, 800, 361/816–818, 752–753, 724–727; 165/80.1–80.5, 105.33, 185; 174/15.1–15.2, 16.1–16.3, 521, 526, 174/547–548; 257/712–722, E23, 88; 454/184; 312/236
See application file for complete search history.

(56) References Cited

U.S. PATENT DOCUMENTS

| | | | | |
|---|---|---|---|---|
| 5,838,542 A * | 11/1998 | Nelson et al. | ................. | 361/704 |
| 5,930,115 A * | 7/1999 | Tracy et al. | ................... | 361/704 |
| 6,049,468 A * | 4/2000 | Learmonth | ................... | 361/816 |
| 6,462,958 B2 * | 10/2002 | Ogata | ........................... | 361/800 |
| 6,903,931 B2 * | 6/2005 | McCordic et al. | ............ | 361/711 |
| 2003/0230400 A1 * | 12/2003 | McCordic et al. | ....... | 165/104.33 |
| 2005/0018411 A1 * | 1/2005 | Lum et al. | ..................... | 361/800 |
| 2006/0187645 A1 * | 8/2006 | Numata | ....................... | 361/704 |
| 2007/0139904 A1 * | 6/2007 | English et al. | ................ | 361/818 |
| 2008/0266807 A1 * | 10/2008 | Lakin et al. | .................... | 361/709 |
| 2010/0157544 A1 * | 6/2010 | Tsao et al. | ..................... | 361/720 |
| 2010/0265665 A1 * | 10/2010 | Kozaka et al. | ................ | 361/717 |
| 2010/0321892 A1 * | 12/2010 | Vander Ploeg et al. | ....... | 361/707 |
| 2011/0192568 A1 * | 8/2011 | Hsieh et al. | ................... | 165/48.1 |
| 2011/0194259 A1 * | 8/2011 | Goriaux et al. | .............. | 361/720 |
| 2011/0205710 A1 * | 8/2011 | Kondo et al. | ................. | 361/714 |

* cited by examiner

*Primary Examiner* — Michail V Datskovskiy
*Assistant Examiner* — Razmeen Gafur
(74) *Attorney, Agent, or Firm* — McClure, Qualey & Rodack, LLP

(57) ABSTRACT

An electronic device, including a circuit board, a communication chip, a first heat sink, a fixer and a shielding mask, is provided. The circuit board has a frame having an opening and several rims surrounding the opening. The communication chip, disposed on the circuit board, is located in the opening of the frame. The first heat sink, disposed on the communication chip, has a first surface facing and contacting the communication chip. The fixer is fixed into the circuit board and the first heat sink, such that the first heat sink remains contacting the communication chip. The shielding mask, disposed on the circuit board, includes a cover and several side boards. The cover covers the communication chip and the first heat sink, such that the cover contacts a second surface of the first heat sink. The side boards are opposite and connected to the rims in parallel.

11 Claims, 2 Drawing Sheets

ELECTRONIC DEVICE WITH HEAT DISSIPATING AND ELECTROMAGNETIC SHIELDING MASK

This application claims the benefit of People's Republic of China application Serial No. 201220023403.4, filed Jan. 18, 2012, the subject matter of which is incorporated herein by reference.

BACKGROUND OF THE INVENTION

1. Field of the Invention

The invention relates in general to an electronic device, and more particularly to an electronic device with a heat dissipating and electromagnetic shielding mask.

2. Description of the Related Art

To quickly dissipate the heat generated by the chip when performing high speed computation, the chip is normally equipped with a heat sink accompanied with a fan to achieve quick dissipation of the heat. The heat sink is often directly adhered on the chip, such that the heat generated by the chip is absorbed by the heat sink via the surface contact between the heat sink and the chip.

However, the design of adhering the heat sink and the chip together cannot assure lasting bonding between the heat sink and the chip. One of the reasons is that in the course of use, the heat generated by the chip causes the adhesive to change such that the chip and the heat sink cannot be constantly bonded together tightly or may even be separated from each other. Once the chip and the heat sink cannot be bonded together tightly, the heat generated by the chip cannot be completely absorbed via the heat sink. Under such circumstance that the heat cannot be dissipated timely, the computing speed will be affected and the chip may even be damaged.

If the chip is a communication chip, the communication chip further needs to be conformed to various regulation related to the test of electromagnetic wave interference. Ordinary heat sink often lacks the design of anti-electromagnetic wave interference. Therefore, it is difficult for a communication chip to dissipate the heat and prevent electromagnetic wave interference at the same time, and it is even more difficult for a small-size communication device which has limited space and cannot provide enough space for the installation of a large-size heat sink to do the same.

SUMMARY OF THE INVENTION

The invention is directed to an electronic device with a heat dissipating and electromagnetic shielding mask. The electronic device of the invention increases the dissipation area for increasing dissipation efficiency and is conformed to various regulation related to the test of electromagnetic wave interference.

According to an embodiment of the present invention, an electronic device, comprising a circuit board, a communication chip, a first heat sink, a fixer and a shielding mask, is provided. The circuit board has a frame disposed thereon. The frame is perpendicular and connected to a top surface of the circuit board and has an opening and several rims surrounding the opening. The communication chip is disposed on the circuit board and located in the opening of the frame. The first heat sink is disposed on the communication chip and has a first surface facing and contacting the communication chip. The fixer penetrates to the top surface from the bottom surface of the circuit board and is fixed between the circuit board and the first heat sink, such that the first heat sink remains contacting the communication chip. The shielding mask is disposed on the circuit board and comprises a cover and several side boards. The cover covers the communication chip and the first heat sink, such that the cover contacts a second surface of the first heat sink. The side boards are protruded from the lower edge of the cover, such that the side boards are opposite and connected to the rims in parallel.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1A:
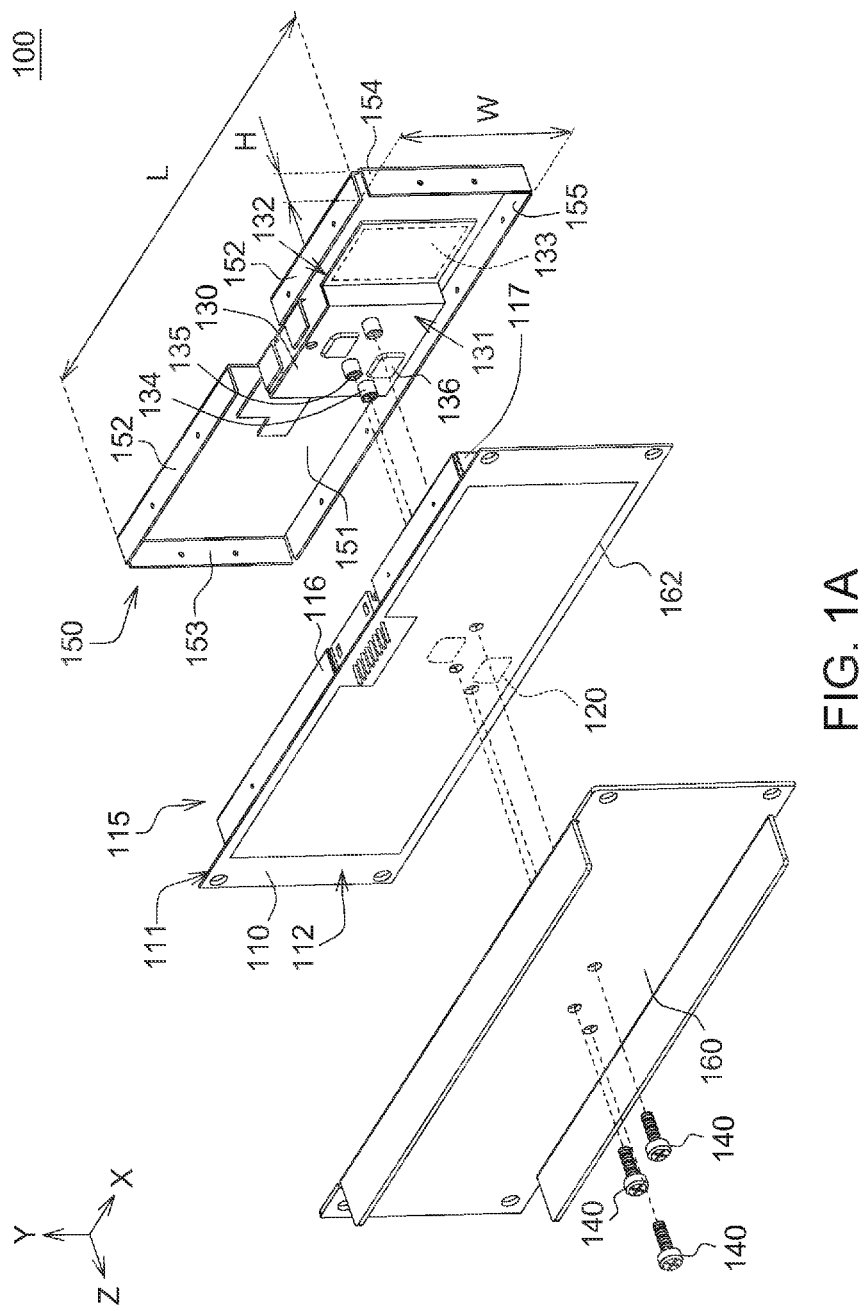
FIG. 1A shows a decomposition diagram of an electronic device with a heat dissipating and electromagnetic shielding mask according to an embodiment of the invention.
Figure 1B:
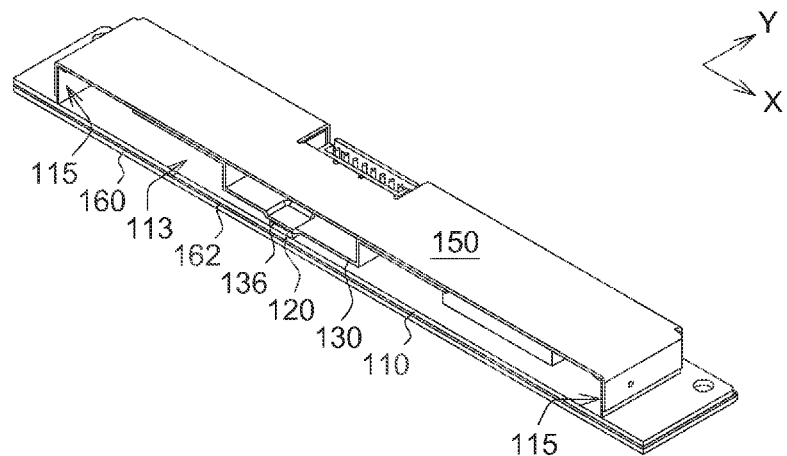
FIG. 1B shows an assembly cross-sectional view of an electronic device of FIG. 1A along an X-axis direction.
Figure 1C:
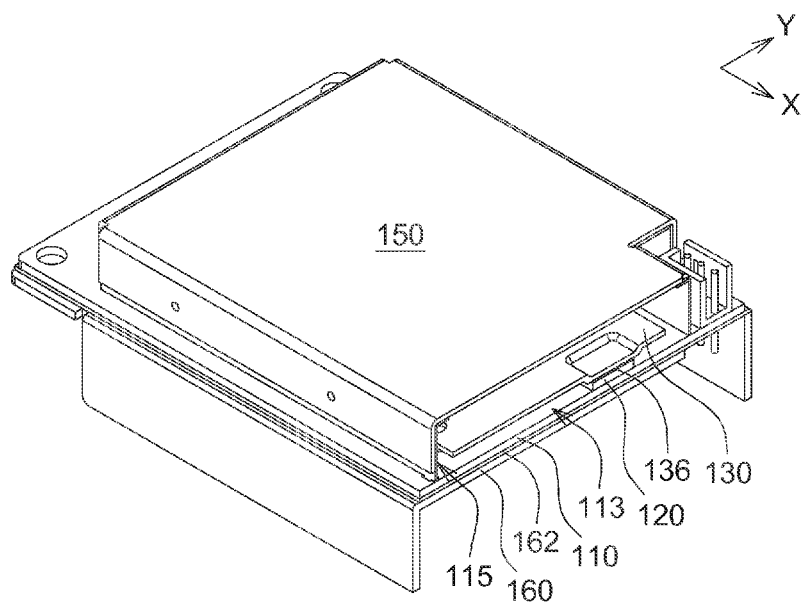
FIG. 1C shows an assembly cross-sectional view of an electronic device of FIG. 1A along a Y-axis direction.

Referring to FIGS. 1A~1C. FIG. 1A shows a decomposition diagram of an electronic device with a heat dissipating and electromagnetic shielding mask according to an embodiment of the invention. FIG. 1B shows an assembly cross-sectional view of an electronic device of FIG. 1A along an X-axis direction. FIG. 1C shows an assembly cross-sectional view of an electronic device of FIG. 1A along a Y-axis direction.

In FIG. 1A, the electronic device 100 refers to various communication products, such as a communication device having wireless transmission and supporting IEEE802.11a/b/g wireless network communication protocol, Bluetooth wireless communication or supporting worldwide interoperability for microwave access (WIMAX) and conforming to various regulation related to the test of electromagnetic wave interference. The electronic device 100 comprises a circuit board 110, a communication chip 120, a first heat sink 130, at least one fixer 140, a shielding mask 150 and a second heat sink 160. The first heat sink 130 and the second heat sink 160 are respectively disposed on the top surface 111 and the bottom surface 112 of the circuit board 110. The first heat sink 130 is disposed on the communication chip 120 and has a first surface (front side) 131 facing the communication chip 120 and contacting the communication chip 120. In addition, the second surface (back side) 132 of the first heat sink 130 contacts the lower part of the cover 151 of the shielding mask 150 and is opposite to the first surface 131, such that the first heat sink 130 and the shielding mask 150 are assembled as a heat dissipating and electromagnetic shielding mask. Therefore, the heat generated by the communication chip 120 is absorbed by the first heat sink 130 and is then transferred to an external environment via the shielding mask 150 to avoid the heat being concentrated on the communication chip 120 and affecting the efficiency of the communication chip 120. In addition, a solder material layer 133, formed by a material such as tin paste with low melting point, is disposed between the cover 151 and the second surface 132 of the first heat sink 130. The solder material layer 133 reduces the thermal resistance between the cover 151 and the first heat sink 130 and increases the dissipation efficiency.

Moreover, the first heat sink 130 has at least one fixing base 134 on the first surface 131. The quantity of the fixing base 134 may be singular or plural, wherein the fixing base 134 corresponds to the location and quantity of the fixer 140. The fixing base 134 may be realized by a stud riveted or welded on the first heat sink 130. The center of the fixing base 134 has a screw hole 135 in which the fixer 140 is engaged. In the present embodiment, the fixer 140 may be realized by a screw. The fixer 140 passes through the circuit board 110 from the second heat sink 160 disposed underneath the circuit board 110, and then passes through the fixing base 134 from the top surface 111 of the circuit board 110 to be fixed into the circuit board 110 and the first heat sink 130, such that the first heat sink 130 remains contacting the communication chip 120. Since the fixer 140 may be constantly fixed into the circuit board 110 and the first heat sink 130, the first heat sink 130 remain being tightly bonded with the communication chip 120.

A contact pad 136 such as heat conductive material like silicone is further disposed between the first heat sink 130 and the communication chip 120. The contact pad 136 reduces the thermal resistance between the communication chip 120 and the first heat sink 130 and increases the dissipation efficiency.

The second heat sink 160 may be selectively disposed on the bottom surface 112 of the circuit board 110. The second heat sink 16 increases the dissipation area underneath the circuit board 110 as well as the structural strength underneath the circuit board 110 and avoids the circuit board 110 being bent and deformed. In the present embodiment, the first heat sink 130 and the second heat sink 160 are formed by a metal such as copper, aluminum or an alloy thereof. In addition, the first heat sink 130 may be realized by a ceramic heat sink, the second heat sink 160 is electrically isolated with the circuit board 110, and the second heat sink 160 may be fixed on the bottom surface 112 of the circuit board 110 by a heat conductive glue 162.

Referring to FIG. 1A~1C, the communication chip 120 is disposed on the circuit board 110 and located in the opening 113 of the frame 115. The frame 115, such as a rectangular frame, has several rims (such as two rims 116 and two rims 117) surrounding the opening 113 and perpendicular to the top surface 111 of the circuit board 110. FIG. 1A only illustrates the rims 116 and 117 on one side, and the remaining rims on the other side are not illustrated. The shielding mask 150, such as a rectangular mask, has a cover 151 and four side boards 152~155 protruded from the lower edge of the cover 151. A predetermined height H may be extended on the Z-axis direction so that the side boards 152 and 154 are opposite and parallel to the rims 116 and 117 respectively. The predetermined height H is equal to (or less than) the vertical height of the rims 116 and 117 from the top surface 111 of the circuit board 110. The width W (in the Y-axis direction) between two opposite side boards 152 and 155 and the length L (in the X-axis direction) between two side boards 153 and 154 respectively are slightly greater than the width of the two rims 116 located on opposite sides and the length of the two rims 117 on opposite sides. Thus, the shielding mask 150 may completely cover the frame 115, and the side boards 152~155 of the shielding mask 150 are opposite and connected to the rims 116 and 117 of the frame 115 in parallel as indicated in FIGS. 1B and 1C.

In addition, the side boards 152~155 and the rims 116 and 117 which are opposite and connected each other may be fastened by way of spot welder or screws (not illustrated). The side boards 152~155 and the rims 116 and 117 which are opposite to each other form double electromagnetic shielding effect, such that the electromagnetic wave generated by the communication chip 120 will not be easily radiated via the gap between the side boards 152~155 and the rims 116 and 117, and the electromagnetic wave interference is reduced accordingly. In the present embodiment, the communication chip 120 may be realized by a communication chip having wireless transmission and supporting IEEE802.11a/b/g wireless network communication protocol, Bluetooth wireless communication or supporting worldwide interoperability for microwave access (WIMAX) and conforming to the regulation related to the test of electromagnetic wave interference.

As indicated in FIG. 1A, the cover 151 of the shielding mask 150 covers the communication chip 120 and the first heat sink 130, such that the cover 151 contacts the second surface 132 of the first heat sink 130. Therefore, the shielding mask 150 not only prevents electromagnetic wave interference, but also dissipates the heat. Since the shielding mask 150 is used for dissipating the heat and shielding electromagnetic wave, there is no need to install extra heat sink, and the electronic device 100 can further reduce the space reserved for the installation of a large-sized heat sink.

According to the electronic device disclosed in the above embodiments of the invention, the heat sink and the shielding mask are combined together to increase dissipation area and dissipation efficiency. In addition, the fixer makes the communication chip and the first heat sink being bonded tightly, and avoids the communication chip and the first heat sink being separated from each other and increasing the thermal resistance. Furthermore, the design with the side boards of the shielding mask being opposite and connected to the rims of the frame in parallel provides double shielding effect and reduces the electromagnetic wave interference generated by the communication chip.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device with a heat dissipating and electromagnetic shielding mask, wherein the electronic device comprises:
   a circuit board having a frame disposed thereon, wherein the frame is perpendicular and connected to a top surface of the circuit board and has an opening and a plurality of rims surrounding the opening;
   a communication chip disposed on the circuit board and located in the opening of the frame;
   a first heat sink disposed on the communication chip, wherein the first heat sink has a first surface facing and contacting the communication chip;
   a fixer penetrating to the top surface from the bottom surface of the circuit board, wherein the fixer is fixed into the circuit board and the first heat sink, such that the first heat sink remains contacting the communication chip; and
   a shielding mask disposed on the circuit board, wherein the shielding mask comprises:
      a cover covering the communication chip and the first heat sink, wherein the cover contacts a second surface of the first heat sink, and the second surface is opposite to the first surface; and
      a plurality of side boards protruded from the lower edge of the cover, wherein the side boards are perpendicular to the top surface of the circuit board, and the side boards are opposite and connected to the rims in parallel.

2. The electronic device according to claim 1, further comprising a solder material layer connected between the cover and the second surface of the first heat sink.

3. The electronic device according to claim 2, wherein the solder material layer is formed by tin paste.

4. The electronic device according to claim 1, further comprising a solder material layer connected between the rims and the side boards.

5. The electronic device according to claim 4, wherein the solder material layer comprises tin paste.

6. The electronic device according to claim 1, further comprising a contact pad disposed between the communication chip and the first heat sink.

7. The electronic device according to claim 6, wherein the contact pad is formed by a heat conductive material.

8. The electronic device according to claim 1, wherein the first surface of the first heat sink has a fixing base having a screw hole corresponding to the fixer, such that the fixer is engaged in the screw hole of the fixing base.

9. The electronic device according to claim 1, wherein the shielding mask is formed by an aluminum alloy.

10. The electronic device according to claim 1, further comprising a second heat sink disposed on the bottom surface of the circuit board.

11. The electronic device according to claim 10, further comprising a heat conductive glue fixed between the second heat sink and the circuit board.

* * * * *